United States Patent
Deuringer et al.

(10) Patent No.: US 9,660,597 B2
(45) Date of Patent: May 23, 2017

(54) VOLTAGE SUPPLY FOR ELECTRICAL FOCUSING OF ELECTRON BEAMS

(71) Applicants: Josef Deuringer, Herzogenaurach (DE); Jürgen Oelschlegel, Nürnberg (DE)

(72) Inventors: Josef Deuringer, Herzogenaurach (DE); Jürgen Oelschlegel, Nürnberg (DE)

(73) Assignee: Siemens Aktiengesellschaft, München (DE)

(*) Notice: Subject to any disclaimer, the term of this patent is extended or adjusted under 35 U.S.C. 154(b) by 243 days.

(21) Appl. No.: 14/494,337

(22) Filed: Sep. 23, 2014

(65) Prior Publication Data
US 2015/0084502 A1 Mar. 26, 2015

(30) Foreign Application Priority Data
Sep. 24, 2013 (DE) .................. 10 2013 219 173

(51) Int. Cl.
*H02M 3/158* (2006.01)
*H03F 3/21* (2006.01)
(Continued)

(52) U.S. Cl.
CPC ............. *H03F 3/211* (2013.01); *H01J 29/58* (2013.01); *H02M 1/088* (2013.01); *H02M 3/158* (2013.01);
(Continued)

(58) Field of Classification Search
CPC .......... H03F 3/211; H03F 2203/21142; H02M 3/158; H01J 29/58; H02J 1/00
(Continued)

(56) References Cited

U.S. PATENT DOCUMENTS

| 4,341,991 A * | 7/1982 | Geboers ............... H04M 19/08 323/225 |
| 5,808,425 A | 9/1998 | Harle |
| 2009/0230285 A1* | 9/2009 | Wright .................. H01J 43/30 250/207 |
| 2014/0077773 A1* | 3/2014 | Shibata ................. H02M 1/32 323/225 |

FOREIGN PATENT DOCUMENTS

| CN | 1448818 A | 10/2003 |
| DE | 29 24 682 A1 | 1/1980 |

(Continued)

OTHER PUBLICATIONS

Chinese Office action for related Chinese Application No. 201410654059.2, dated Sep. 30, 2015, with English Translation.
(Continued)

*Primary Examiner* — Douglas W Owens
*Assistant Examiner* — Wei Chan
(74) *Attorney, Agent, or Firm* — Lempia Summerfield Katz LLC

(57) ABSTRACT

A rapidly regulable high-voltage supply for the electrical focusing of an electron beam using a high-voltage final stage is provided. The high-voltage final stage includes a plurality of amplification elements that are interconnected in a series configuration with a first high-voltage connection, and a potential dividing chain including a series of potential dividing elements. The potential dividing chain is interconnected with the first high-voltage connection and has a signal interconnection with the plurality of amplification elements, so that when a voltage is applied across the potential dividing chain, a difference in voltages between a signal input to any amplification element of the plurality of amplification elements and a signal input to a next amplification element of the plurality of amplification elements has a same sign.

18 Claims, 4 Drawing Sheets

(51) Int. Cl.
  *H01J 29/58* (2006.01)
  *H02M 1/088* (2006.01)
  *H03F 3/08* (2006.01)
  *H03F 3/217* (2006.01)
  *H05G 1/52* (2006.01)

(52) U.S. Cl.
  CPC ............. *H03F 3/08* (2013.01); *H03F 3/2173* (2013.01); *H05G 1/52* (2013.01); *H03F 2200/93* (2013.01); *H03F 2203/21142* (2013.01)

(58) Field of Classification Search
  USPC ....... 315/5.34, 299, 307, 200 R, 209 R, 224; 330/295, 263, 268, 297; 323/271, 311, 323/223–226, 229; 250/207, 214 AG, 250/363.09, 383
  See application file for complete search history.

(56) References Cited

FOREIGN PATENT DOCUMENTS

| | | |
|---|---|---|
| DE | 2924682 A1 | 1/1980 |
| EP | 0750332 A2 | 12/1996 |
| JP | S6314210A A | 1/1988 |
| JP | H06217539 A | 8/1994 |
| JP | 2001331225 A | 11/2001 |

OTHER PUBLICATIONS

German Office Action dated Jul. 21, 2014 in corresponding German Patent Application No. DE 10 2013 219 173.1 with English translation.
Wikipedia: "Cascode"; https://en.wikipedia.org/w/index.php?title=Cascode&oldid=743724701, webpage last modified Oct. 10, 2016.

\* cited by examiner

VOLTAGE SUPPLY FOR ELECTRICAL FOCUSING OF ELECTRON BEAMS

This application claims the benefit of DE 10 2013 219 173.1, filed on Sep. 24, 2013, which is hereby incorporated by reference in its entirety.

BACKGROUND

The present embodiments relate to a high-voltage final stage.

In the case of modern X-ray tubes, the position of the beam and the quality of the beam are varied by magnetic or electric fields. Use has mostly been made for variable focus size and focus position of a system of magnets, and the electron beam is blocked by electric fields. If these electrodes are to take over the function of the magnetic system, one is to be provided with a voltage source that may provide a constant focusing voltage and a rapidly alterable deflecting voltage.

Due to the high accelerating voltage, a deflecting voltage of several kilovolts is to be provided, and this may not be built up using typical linear transistor final stages each having one transistor per output polarity. For deflection of the beam in both directions, the final stage is to supply a bipolar voltage. For the purpose of setting the working point, a cross current is to be avoided because of the power losses that result with these high voltages. The final stage is to be designed for a capacitive load.

In the prior art, a bipolar voltage multiplier cascade, for example, is a known way of producing the deflection voltages. However, the cascade with capacitors and diodes limits the maximum current, and hence the dynamics. Use is also made of low-voltage final stages, the output signals from which are transformed to a high voltage by a transformer. The conversion ratio of the transformer drops at low frequencies, and the transformer may not produce DC voltages. Also known are bipolar high-voltage switched-mode regulators, the output signal from which is filtered. These have a residual ripple that is interfering in many applications.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a high-voltage supply for the purpose of electrical focusing of electron beams, which has a highly dynamic response, a large bandwidth and high precision in the output signal, is provided.

One embodiment of a high-voltage final stage includes a first high-voltage connection and a plurality of first amplification elements. The first amplification elements are connected in series and have an interconnection with the first high-voltage connection. The high-voltage final stage also includes a potential dividing chain. The potential dividing chain includes a series of potential dividing elements. The potential dividing chain is interconnected with the first high-voltage connection. In what follows, the potential dividing elements and the amplification elements are numbered starting from the first high-voltage connection, and are identified by corresponding indices n. Along the potential dividing chain, there is, at each of the potential dividing elements, a sequence, indexed by n, of voltages that are fractions of the voltage applied between an end that is distant from the first high-voltage connection and the first high-voltage connection. The sequence of voltages is monotonically increasing or decreasing depending on the polarity of the applied voltage and the reference potential. In accordance with this numbering convention, the signal input of the first amplification element number n has a first signaling interconnection with the potential dividing element number n such that, when a voltage is applied across the potential dividing chain, a voltage at a signal input to a first amplification element number n is in every case smaller or in every case larger, as applicable, by comparison with a voltage at a signal input to a first amplification element number n+1. In other words, the difference between the voltages at the signal input to the amplification element number n and the signal input to the amplification element number n+1 have in every case the same sign.

The monotonic sequence of voltages at the potential dividing elements thus produces a reference potential for the individual amplification elements such that, in conjunction with a self-stabilizing effect from negative feedback, the result is a predefined subdivision over the amplification elements of a voltage applied across the series of amplification elements.

A series configuration of the amplification elements thus has the advantageous effect that a voltage applied across the series configuration may be distributed across the individual amplification elements.

The system for the rapid regulation of a high-voltage signal, together with the high-voltage source using the system, share the advantages of the high-voltage final stage.

In the method for the operation of a system with two high-voltage final stages connected in series, a regulator controls actuation elements such that the system is only ever one of the two high-voltage final stages that conducts a current from a high-voltage source through the amplification elements to a high-voltage output, at which the two high-voltage final stages are interconnected with each other.

This prevents a current from the high-voltage source from flowing away directly through the amplification elements, and increasing the power loss.

In one embodiment of the high-voltage final stage, the high-voltage final stage also includes one or more components (e.g., resistances) each in series with a signal output of an amplification element, where the component or components is/are chosen and arranged such that the amplification element counteracts a change in signal level at a signal output. In other words, the component effects or the components effect negative feedback for the first amplification element concerned.

The negative feedback for the individual amplification elements in the series of amplification elements provides that deviations in individual amplification elements are not self-amplifying, but are balanced out. By this, any overloading and self-destruction of an amplification element due to an excessive falling voltage may be prevented, in that a stable distribution of the voltages at the amplification elements is established.

In one embodiment, the high-voltage final stage also includes a non-linear element and a second high-voltage connection, where the non-linear element is connected in series with the potential dividing chain, between the first high-voltage connection and the second high-voltage connection. When the voltage across the non-linear element is above a predefined threshold, the non-linear element conducts current, and below the predefined threshold, the non-linear element essentially does not. "Essentially" may provide that below the threshold voltage, the current is less than one tenth, one hundredth or one thousandth of a current that flows through the potential dividing chain when the high-voltage final stage is operating as intended. Further, the high-voltage final stage has an actuation element, the resistance of which may be set between a high-ohmic state and a low-ohmic state, and which is connected in series with the plurality of the first amplification elements, between the first high-voltage connection and the second high-voltage connection. A second signal interconnection is connected between the non-linear element and the actuation element such that when the actuation element is in the high-ohmic state, a first current flows from the potential dividing chain through the non-linear element to the high-voltage output, and when the actuation element is in the low-ohmic state, a second current flows from the potential dividing chain through the non-linear element to the second high-voltage connection. In this case, in the low-ohmic state, the first current no longer flows through the non-linear element, but instead via the actuation element, in that the voltage at the non-linear element falls below the threshold value because of the parallel low-ohmic actuation element. In this situation, the magnitude of the first current also changes due to the changed voltage. For this reason, the changed first current is referred to as a second current.

Because of the second signal interconnection, the non-linear element and the actuation element permit current to continue flowing through the potential dividing chain when the actuation element is in its high-ohmic state, and the voltages at the individual signal inputs to the amplification elements remain stable. When the actuation element is in a low-ohmic state, a current flows through the amplification elements, and negative feedback is realized via the second signal interconnection for the amplification element neighboring on the actuation element.

In one embodiment of the high-voltage final stage, the first amplification components are metal oxide field effect transistors (MOSFETs).

MOSFETs are distinguished by a high resistance between the signal input and the signal output, which in the blocked state reduces the power losses of the high-voltage final stage.

In one embodiment of the high-voltage final state, the non-linear element is a Zener diode.

A Zener diode enables a component that becomes conducting above a threshold voltage to be realized in the simplest way.

In one embodiment of the high-voltage final stage, the actuation element is an opto-coupler.

An opto-coupler provides, in a reliable and simple way, potential separation from a regulator, and makes it possible to position the actuation element independently of the regulator's reference potential.

In one embodiment of the system for rapid regulation of a high-voltage signal, the high-voltage output is the second high-voltage connection of the first high-voltage final stage.

In that the high-voltage final stage is connected in series with the consumer device, with the system of one or more of the present embodiments, no currents in the high-voltage branch that cannot contribute to the output current and thus produce losses arise.

In one embodiment of the system, the system includes a second high-voltage final stage. The second high-voltage connection of the first high-voltage final stage is interconnected electrically with the high-voltage output and to a third high-voltage connection of the second high-voltage final stage, which corresponds functionally to the first high-voltage connection of the first high-voltage final stage. The regulator is further arranged to provide a second regulation signal at a second control signal output, where the actuation element of the second high-voltage final stage has a fourth signal interconnection with the second control signal output.

A second high-voltage final stage, connected in series, makes it possible to effect bipolar actuation of the high-voltage output in terms of a potential that lies between the potentials of the first high-voltage connection and the second high-voltage connection. The losses of the system when there is a capacitive load are minimal if the output voltage does not change because the amplification elements of both high-voltage final stages are blocked.

In one embodiment of the method for operating the system, the level or levels, as applicable, of the first regulation signal and/or of the second regulation signal is/are dependent on the difference between the set-point signal and the actual-value signal.

A proportional regulator, for example, that has a particularly low ripple in the high-voltage signal may thus be realized.

In another embodiment of the method, the level or levels, as applicable, of the first regulation signal and/or of the second regulation signal changes or change, as applicable, between a first predefined value and a second predefined value. A ratio between a first time duration, over which the level assumes a first value, and a second time duration, over which the level assumes a second value, is, for example, dependent on the difference between the set-point signal and the actual-value signal.

Pulse width modulation of the high-voltage final stage, in which the high-voltage final stages are advantageously either blocked or switched through, so that the power loss is reduced in an advantageous way may be realized.

DETAILED DESCRIPTION

Figure 1:
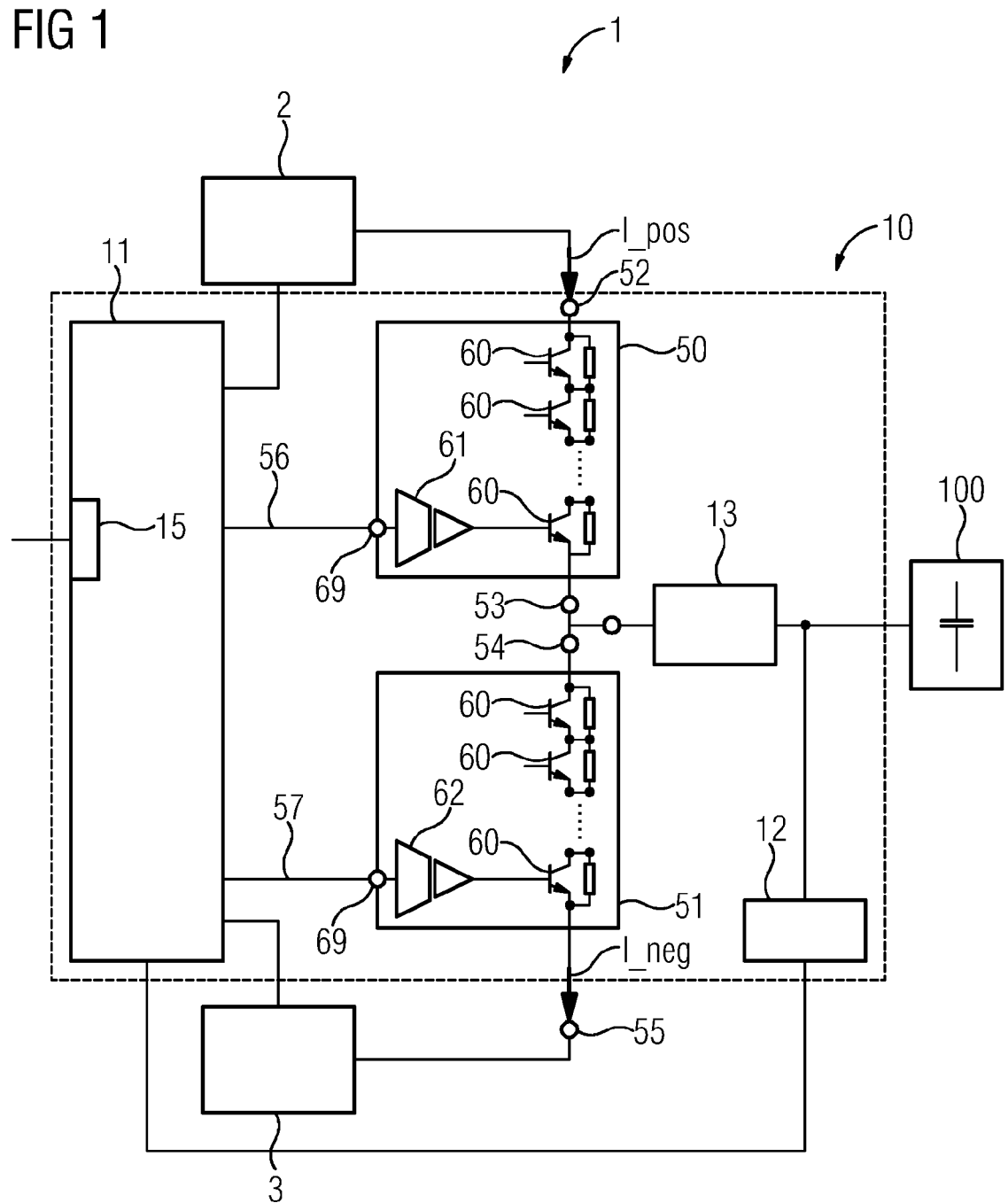
FIG. 1 shows a schematic representation of one embodiment of a rapidly regulable high-voltage supply.

FIG. 1 shows one embodiment of a rapidly regulable high-voltage supply. The rapidly regulable high-voltage supply 1 includes a system 10 for rapid regulation of a high-voltage signal together with a positive high-voltage source 2 and a negative high-voltage source 3 (e.g., high-voltage sources). In one embodiment, the high-voltage sources 2, 3 supply a voltage of 5 kV. High voltages or high-voltage signals, as applicable, may be potentials that are at least several times the main supply voltage (e.g., 1 kV, 5 kV or more). The high-voltage sources 2, 3 are interconnected electrically with a first high-voltage connection 52 and a fourth high-voltage connection 55.

The system 10 includes two high-voltage final stages 50, 51 that are connected in series between the first high-voltage connection 52 and the fourth high-voltage connection 55. The first high-voltage final stage 50 and the second high-voltage final stage 51, for example, are interconnected with each other through the second high-voltage connection 53 or the third high-voltage connection 54, as applicable. This interconnection point makes available a high-voltage output signal from the system 10, which is fed through a filter 13 to a load 100. Depending on the mode of operation, which will be explained later in connection with FIG. 4, the filter 13 may be omitted. In one embodiment, the load 100 is a purely capacitive load, and the filter 13 is a low-pass filter.

Electrically interconnected with the second high-voltage connection 53 or the third high-voltage connection 54, as applicable, is a measuring sensor 12. From the high-voltage output signal, the measuring sensor 12 derives, as a function of the high-voltage output signal, a measurement signal that is fed to a regulator 11 of the system 10. The regulator 11 compares the measurement signal with a set-point signal that is predefined in the regulator 11 (e.g., from a program memory) or may be set for the regulator 11 via an interface 15.

If the measurement signal indicates too high a value for the high-voltage output signal, then, via the fourth signal interconnection 57, the regulator 11 actuates the high-voltage final stage 51 such that the high-voltage final stage 51 allows a current to flow from the third high-voltage connection 54 to the negative high-voltage source 3, which causes a lowering of the high-voltage output signal. If the measurement signal indicates too low a value for the high-voltage output signal, then, via the third signal interconnection 56, the regulator 11 actuates the high-voltage final stage 50 such that the high-voltage final stage 50 allows a current to flow to the second high-voltage connection 53 from the positive high-voltage source 3, which raises the high-voltage output signal.

In the case of a purely capacitive load 100, the high-voltage final stages 50, 51 may be used as switches that allow a charge to flow, as applicable, to or from the capacitive load 100 and to adjust the high voltage at the condenser, which, in circuitry terms, the capacitive load represents. In order to reduce the ripple in the high-voltage at the load 100, the filter 13 may, for example, be constructed as a low-pass filter. In this situation, if the voltage at the capacitive load remains unchanged, the two high-voltage final stages 50, 51 may be switched to a non-conducting state, so that only minimal leakage currents together with stabilization currents flow, and the power loss of the rapidly regulable high-voltage supply 1 is reduced. Details will be explained further for FIGS. 2 and 3.

For an ohmic load 100, the system 10 may include only one high-voltage final stage 50, and the load is arranged in series with the high-voltage final stage 50, between a high-voltage source 1, 2 and the high-voltage final stage 50. The high-voltage final stage 50 functions as a variable resistance that, as a potential divider in conjunction with the load 100, varies the voltage drop across the load 100.

Figure 2:
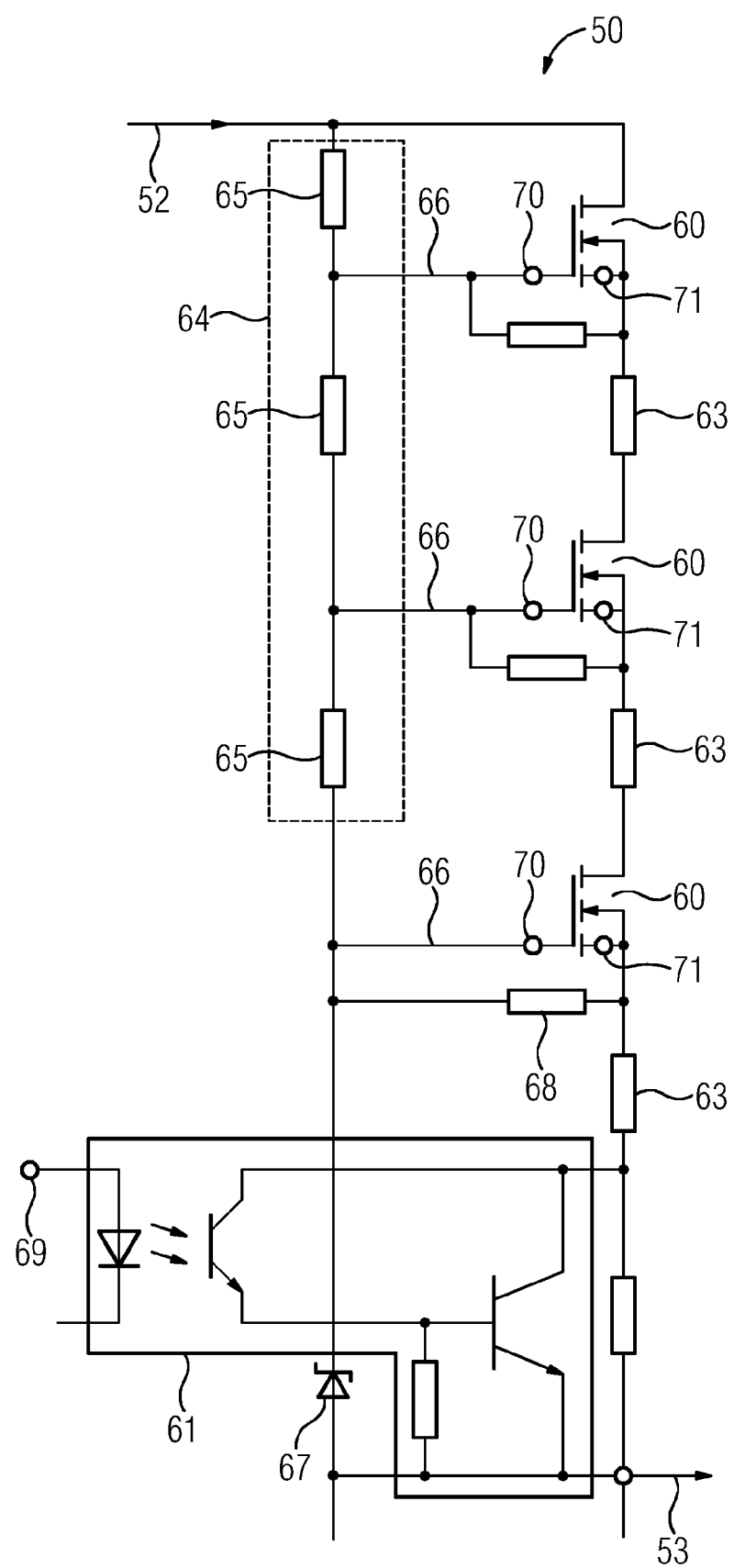
FIG. 2 shows a schematic representation of one embodiment of a high-voltage final stage.

FIG. 2 shows a schematic representation of one embodiment of a high-voltage final stage 50. This applies equally well for the high-voltage final stage 51.

The high-voltage final stage 50 includes several groups of components provided for function of the high-voltage final stage 50. There is a potential dividing chain 64 that includes a chain of potential dividing elements 65 connected in series. At one end, the potential dividing chain 64 is interconnected electrically with the first high-voltage connection 52. At an opposite end, the potential dividing chain 64 is connected in series with a non-linear component 67 that is interconnected electrically with the second high-voltage connection 53.

In one embodiment of the high-voltage final stage 51, the potential dividing elements 65 are resistors, and the non-linear component is a Zener diode. A potential applied to the high-voltage connections 52, 53 then drops in steps across the potential dividing elements 65 and the non-linear component 67, according to the values of the resistances and the blocking voltage of the Zener diode, so that the resulting values of the potentials between the potential dividing elements 65 and the non-linear component 67 is a series of voltage values. The series of voltage values is monotonically increasing or decreasing, as applicable, depending on a direction in which the elements in the series configuration are numbered and the sign of the applied potential. Instead of the resistors and the Zener diode, other components (e.g., active voltage regulators) may also replace some of the elements in the chain.

In the following, the assumption is made in the description that the first high-voltage connection 52 has a positive potential relative to the third high-voltage connection 54. The circuits of one or more of the present embodiments may, however, also be realized with the reverse polarity by the use of appropriate complementary components.

As a further group of elements, the high-voltage final stage 50 includes a series of amplification elements 60 that are also connected in series in a chain, where one end of the chain is again interconnected electrically with the first high-voltage connection 52. The amplification elements 60 are interconnected with each other through resistors 63. In FIG. 2, the amplification elements 60 are shown as MOSFETs, but the amplification elements 60 may be other field effect transistors, bipolar transistors, or other amplification elements with adequate voltage withstand.

Between the signal input to an amplification element 60 and a corresponding interconnection point between two potential dividing elements 65, an electrical first signal interconnection that holds the signal input to the amplification element concerned 60 at an essentially constant potential is provided in each case. The essentially constant potential, as explained for the potential divider, decreases monotonically along the chain. The first signal interconnection in FIG. 2 is a direct ohmic interconnection, but a resistor or a network of components may be provided. In one embodiment, frequency filtering is provided, and/or components are provided to protect against overvoltage at the signal input.

If the voltage drops at the signal output 71, the source connection for the MOSFET, then the potential difference relative to the signal input 70, the gate of the MOSFET, increases. This reduces the resistance of the MOSFET between a drain and a source of the MOSFET, so that the voltage drop at the resistor 63, which is arranged at the signal output 71, increases, and the potential difference between the signal input 70, the gate, and the signal output 71, the source, reduces. This stabilizes the voltage drop at the amplification element concerned. A comparable function may also be provided for other amplification elements 60, such as other types of field effect transistor or bipolar transistors.

The high-voltage final stage 50 also includes an actuation element 61. FIG. 2, shows, as the actuation element 61, an opto-coupler that is distinguished by simultaneously achieving potential separation between the regulator 11 and the high-voltage final stage 50, 51. However, the actuation element 61 may be another type of component, with a resistance that may be altered by the regulator. Other embodiments of the actuation element 61 include transistors or field effect transistors.

The actuation element 61 is connected in series with the plurality of amplification elements between the first high-voltage connection 52 and the second high-voltage connection 53. At the same time, the actuation element 61 is connected in parallel, via the resistors 63, 63, with the non-linear element 67, the Zener diode.

If the actuation element 61 is in a high-ohmic state, then the potentials at the signal input 70 and the signal output 71 of the amplification element 60, which is neighboring to the actuation element 61, are essentially identical, so that the amplification element 60 is blocking. The resistance values of the potential dividing chain 64, of the resistor 68 and of the resistor 63, together with an optional resistor shown in FIG. 2 parallel to the actuation element 61 are arranged so that the current in the potential dividing chain 64 flows away mainly (e.g., almost completely apart from a leakage current through the actuation element 61) as the first current via the non-linear element 67, the Zener diode.

If the actuation element 61 is actuated by a regulator 11 through a control input 69 such that the actuation element 61 goes low-ohmic, the potential drops at the signal output 71 from the first amplification element that is neighboring to the actuation element. At the same time, a second current flows through the resistors 68, 63 and the actuation element 61 to the second high-voltage connection 53. The current in the potential dividing chain 64 then flows away mainly (i.e., almost completely apart from a leakage current through the non-linear element 67) through the actuation element 61.

In this case, the first current and the second current have essentially the same magnitude. However, the actuation element 61 may be actuated by the regulator 11 such that the current in the potential dividing chain 64 is split between the non-linear element 67 and the actuation element 61. The sum of the magnitude of the first current and the magnitude of the second current corresponds to the magnitude of the current in the potential dividing chain 64.

The second current causes a voltage drop at the resistance 68, which leads to a potential difference between the signal input 70 and the signal output 71 for the amplification element 60, numbered n. Hence, in FIG. 2, the MOSFET becomes conducting because of the potential difference between gate and source of the MOSFET. This causes the potential at the signal output 71 for the nearest neighboring amplification element 60, numbered n−1, to drop, so that the procedure repeats for this amplification element and propagates, via the first amplification elements that are connected in series, as far as the first high-voltage connection, so that the maximum current flowing between the first high-voltage connection 52 and the second high-voltage connection 53 is essentially limited by the resistances 63 in the series of amplification elements 60. In one embodiment, instead of the resistances 63, other components with a suitable, finite DC resistance may be used.

Figure 3:
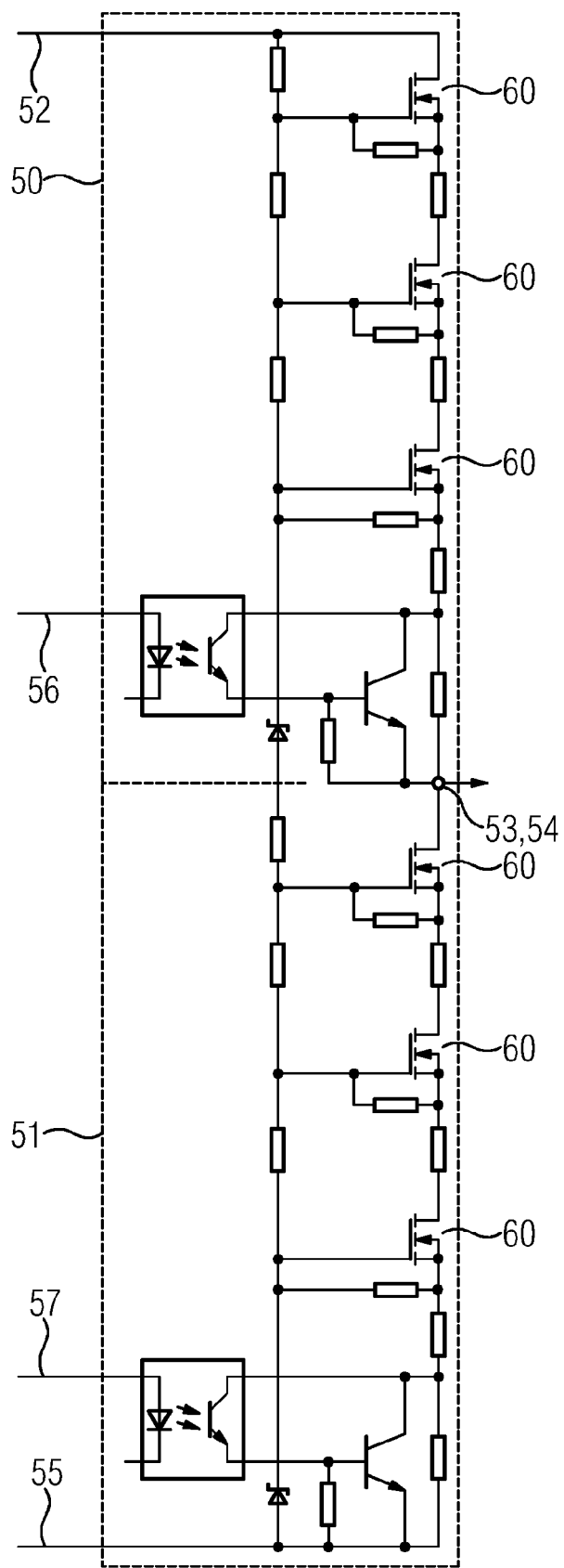
FIG. 3 shows a schematic representation of an exemplary connection of two high-voltage final stages from a system for rapid regulation of a high-voltage signal.

The number of amplification elements 60 that are connected in series is not determined by the number shown in FIGS. 2 and 3. The number of amplification elements 60 is arbitrarily scalable as a function of the voltage withstand of the amplification elements 60 and of the voltage applied between the first high-voltage connection 52 and the second high-voltage connection 53, or between the first high-voltage connection 52 and the fourth high-voltage connection 55, as applicable, without altering or deviating from the principle of the high-voltage final stage of one or more of the present embodiments.

FIG. 3 shows a section of a system in accordance with one or more of the present embodiments, for the rapid regulation of a high-voltage signal with a first high-voltage final stage 50 and a second high-voltage final stage 51. The two are interconnected with each other via the second high-voltage connection 52 and the third high-voltage connection 54. Through this, as already described for FIG. 1, an electric load (e.g., a capacitive load) may be connected. In the case of a capacitive load 100, when the voltage set-point at the high-voltage output 53, 54 is unaltered, both high-voltage final stages 50, 51 may be in a blocked state.

In one embodiment, the regulator 11 is thus arranged so that if an actual high-voltage value, determined at the high-voltage output 53, 54 via the measurement sensor 12, agrees with a prescribed high-voltage set-point value, the actuation elements 61 for the first high-voltage final stage 50 and the second high-voltage final stage 51 are actuated via the third signal interconnection 56 and the fourth signal interconnection 57 such that both high-voltage final stages are in a blocked state, and no current flows from the high-voltage sources 2, 3 via the amplification elements 60.

If the actual high-voltage value determined is greater than a specified high-voltage set-point value, then the second high-voltage final stage 51 is actuated by the regulator 11 such that the amplification elements 60 of the second high-voltage final stage 51 become conductive, and charge flows out from the capacitive load 100, and the voltage drops. If the actual high-voltage value determined is less than a specified high-voltage set point value, then the first high-voltage final stage 50 will be actuated by the regulator 11 such that the amplification elements 60 of the first high-voltage final stage 50 become conductive, and charge from the capacitive load 100 increases, and the voltage rises.

In one embodiment, the regulator 11 is arranged so that that the two high-voltage final stages 50, 51 are never both switched to a conductive state. This achieves the advantageous effect that power is drawn from the high-voltage sources 2, 3 essentially only if the power flows through the load 100. Essentially provides that the only current flowing continuously through the potential dividing chain 64 represents less than one tenth, one hundredth or one thousandth of the maximum current through the amplification elements.

For one embodiment, the regulator 11 switches the high-voltage final stages 50, 51 between a conductive and a non-conductive state. A low-pass filter 13 that reduces voltage fluctuations at the high-voltage output 53, 54 may, for example, be provided.

In one embodiment, the regulator 11 may also actuate the high-voltage final stage in an analog mode such that a current flowing through the high-voltage final stages assumes any chosen value between zero and a maximum current that is limited by the sum of the resistance values of the resistances 63. This makes the fluctuation in the high voltage at the high-voltage connection 53, 54 smaller.

In one embodiment of the system 10 for the rapid regulation of a high-voltage signal, the system 10 may include only one high-voltage final stage 50 that is connected in series with a load 100 that is at least partially ohmic. In this case, the regulator 11 may actuate in the analog mode already described.

Figure 4:
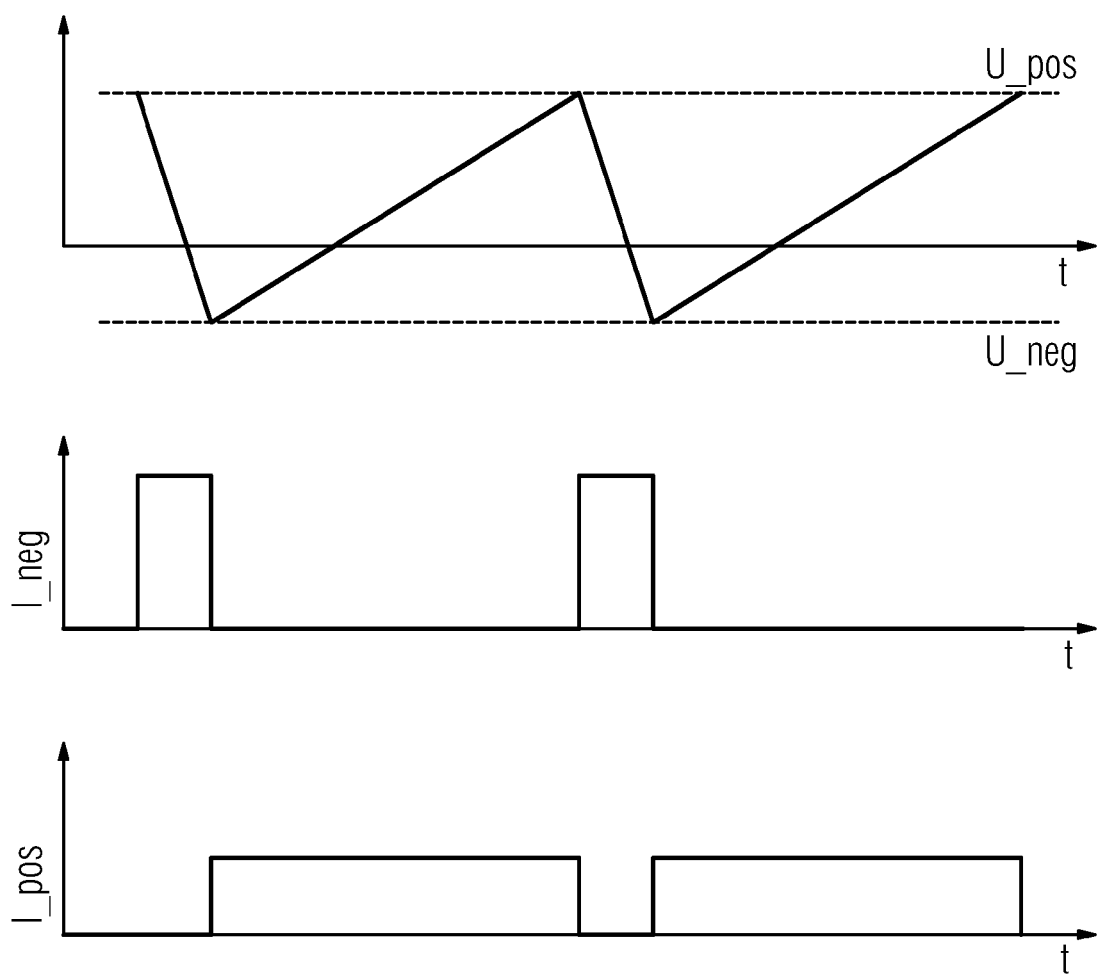
FIG. 4 shows a schematic representation of an exemplary course of a signal for a high-voltage supply as a function of time.

FIG. 4 shows a graph of a voltage at the load 100 and output signals from the regulator 11 at the third signal interconnection 56 and at the fourth signal interconnection 57 for a rapidly regulable high-voltage supply in accordance with one or more of the present embodiments, as in FIG. 1.

The terms U_pos and U_neg are used respectively to designate an upper and a lower limit for the voltage at the load 100. As long as there is a positive signal applied on the fourth signal interconnection 57, labeled I_neg in FIG. 4 for an outflowing current, the second high-voltage final stage 51 is conductive, and charge flows out and away from the capacitive load 100, causing the voltage to drop.

When the lower limit U_neg is reached for the voltage at the load 100, the regulator 11 switches the signal on the fourth signal interconnection to zero, causing the second high-voltage final stage 51 to go into a blocked state. At the same time, the regulator 11 switches the signal on the third signal interconnection 56 to the first high-voltage final stage 50 to a positive value. The first high-voltage final stage 50 becomes conductive, a current flows to the capacitive load 100, and the voltage at the load 100 rises again until the upper limiting value is reached.

FIG. 4 shows that the two signal interconnections 56, 57 never simultaneously receive a signal value from the regulator 11 that switches the two high-voltage final stages 50, 51 into a conductive state at the same time. This avoids a current flowing from the high-voltage sources 2, 3 through the high-voltage final stages 50, 51, bypassing the load 100 and producing losses.

Instead of an on and off switching of the high-voltage final stages, in one embodiment of the high-voltage supply 1, the signal outputs 56, 57 may adopt any desired values between zero and a maximum value. This is of particular advantage if the load has a significant ohmic portion, and a continuous current is to be provided in order to keep the voltage at the load 100 constant. The regulator 11 then outputs via the third and/or fourth signal interconnection an analog signal level that permits a current, in the actuation element 61 or the actuation element 62, as applicable, that is provided for the purpose of maintaining the voltage at the load 100 to flow.

Although the invention has been illustrated and described in more detail by the exemplary embodiments, the invention is not restricted to the examples disclosed. Other variations may be derived herefrom by a specialist without going outside the ambit of the scope of protection.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A high-voltage final stage comprising:
a first high-voltage connection;
a plurality of first amplification elements that have an interconnection in a series configuration with the first high-voltage connection;
a potential dividing chain comprising a series of potential dividing elements, the potential dividing chain being interconnected with the first high-voltage connection, and when the series of first amplification elements and potential dividing elements is numbered starting from the first high-voltage connection, in each case a signal input to a first amplification element of the plurality of first amplification elements numbered n having a first signal interconnection with a potential dividing element of the series of potential dividing elements numbered n, so that when a voltage is applied across the potential dividing chain, a difference in voltages at a signal input to a first amplification element of the plurality of first amplification elements numbered n and at a signal input to a first amplification element of the plurality of first amplification elements numbered n+1 in every case has the same sign;
one or more components, each of the one or more components being arranged in series with a signal output from a first amplification element of the plurality of first amplification elements, such that the first amplification element counteracts any change in a signal level at a signal output of the first amplification element; and
a second high-voltage connection and a non-linear element that is connected in series with the potential dividing chain between the first high-voltage connection and the second high-voltage connection, when the non-linear element has an applied voltage that is above a predefined threshold, the non-linear element conducts current; and
an actuation element, a resistance of the actuation element being adjustable between a high-ohmic state and a low-ohmic state, the actuation element being connected in series with the plurality of the first amplification elements between the first high-voltage connection and the second high-voltage connection,
wherein a second signal interconnection between the non-linear element and the actuation element is configured such that when the actuation element is in the high-ohmic state, a first current flows from the potential dividing chain through the non-linear element to the second high-voltage connection, and when the actuation element is in the low-ohmic state, a second current flows from the potential dividing chain through the actuation element to the second high-voltage connection.

2. The high-voltage final stage of claim 1, wherein the plurality of first amplification elements are metal oxide field effect transistors.

3. The high-voltage final stage of claim 1, wherein the non-linear element is a Zener diode.

4. The high-voltage final stage of claim 1, wherein the actuation element is an opto-coupler.

5. A system for rapidly regulating a high-voltage signal, the system comprising:
a first high-voltage final stage comprising:
a first high-voltage connection; a plurality of first amplification elements that have an interconnection in a series configuration with the first high-voltage connection; and
a potential dividing chain comprising a series of potential dividing elements, the potential dividing chain being interconnected with the first high-voltage connection, and when the series of first amplification elements and potential dividing elements is numbered starting from the first high-voltage connection, in each case a signal input to a first amplification element of the plurality of first amplification elements numbered n having a first signal interconnection with a potential dividing element of the series of potential dividing elements numbered n, so that when a voltage is applied across the potential dividing chain, a difference in voltages at a signal input to a first amplification element numbered n and at a signal input to the first amplification element numbered n+1 in every case has the same sign;
a high-voltage output; and
a regulator configured for producing at a first control signal output a first regulating signal from a set-point signal and an actual value signal,
wherein the actual value signal is derived from a signal from the high-voltage output,
wherein an actuation element for the first high-voltage final stage has a second signal interconnection with the first control signal output.

6. The system of claim 5, wherein a high-voltage output from a second high-voltage connection is the first high-voltage final stage.

7. The system of claim 5, further comprising a second high-voltage final stage, the second high-voltage final stage comprising a first high-voltage connection, a plurality of first amplification elements that have an interconnection in a series configuration with the first high-voltage connection, and a potential dividing chain comprising a series of potential dividing elements, the potential dividing chain being interconnected with the first high-voltage connection, and when the series of first amplification elements and potential dividing elements is numbered starting from the first high-voltage connection, in each case a signal input to a first amplification element of the plurality of first amplification elements numbered n having a first signal interconnection with a potential dividing element of the series of potential dividing elements numbered n, so that when a voltage is applied across the potential dividing chain, a difference in voltages at a signal input to a first amplification element numbered n and at a signal input to the first amplification element numbered n+1 in every case has the same sign,
wherein a second high-voltage connection of the first high-voltage final stage is electrically interconnected with a third high-voltage connection of the second high-voltage final stage and with the high-voltage output, and
wherein the regulator is configured to provide a second regulating signal at a second control signal output, and an actuation element of the second high-voltage final stage includes a third signal interconnection with the second control signal output.

8. The system of claim 5, wherein the first high-voltage final stage further comprises one or more components, each of the one or more components being arranged in series with a signal output from a first amplification element of the plurality of first amplification elements, such that the first amplification element counteracts any change in a signal level at a signal output of the first amplification element.

9. The system of claim 8, wherein the first high-voltage final stage further comprises:
a second high-voltage connection and a non-linear element that is connected in series with the potential dividing chain between the first high-voltage connection and the second high-voltage connection, wherein when the non-linear element has an applied voltage that is above a predefined threshold, the non-linear element conducts current; and
an actuation element, a resistance of the actuation element being adjustable between a high-ohmic state and a low-ohmic state, the actuation element being connected in series with the plurality of the first amplification elements between the first high-voltage connection and the second high-voltage connection,
wherein a second signal interconnection between the non-linear element and the actuation element is configured such that when the actuation element is in the high-ohmic state, a first current flows from the potential dividing chain through the non-linear element to the second high-voltage connection, and when the actuation element is in the low-ohmic state, a second current flows from the potential dividing chain through the actuation element to the second high-voltage connection.

10. The system of claim 5, wherein the plurality of first amplification elements are metal oxide field effect transistors.

11. The system of claim 9, wherein the non-linear element is a Zener diode.

12. The system of claim 9, wherein the actuation element is an opto-coupler.

13. A rapidly regulable high-voltage supply for electrical focusing of an electron beam, the rapidly regulable high-voltage supply comprising:
a system for rapid regulation of a high-voltage signal, the system comprising:
a first high-voltage final stage comprising:
a first high-voltage connection;
a plurality of first amplification elements that have an interconnection in a series configuration with the first high-voltage connection; and
a potential dividing chain comprising a series of potential dividing elements, the potential dividing chain being interconnected with the first high-voltage connection, and when the series of first amplification elements and potential dividing elements is numbered starting from the first high-voltage connection, in each case a signal input to a first amplification element of the plurality of first amplification elements numbered n having a first signal interconnection with a potential dividing element of the series of potential dividing elements numbered n, so that when a voltage is applied across the potential dividing chain, a difference in voltages at a signal input to a first amplification element numbered n and at a signal input to the first amplification element numbered n+1 in every case has the same sign;
a high-voltage output; and
a regulator configured for producing at a first control signal output a first regulating signal from a set-point signal and an actual value signal,
wherein the actual value signal is derived from a signal from the high-voltage output,
wherein the actuation element for the first high-voltage final stage has a second signal interconnection with the first control signal output; and a high-voltage source.

14. The rapidly regulable high-voltage supply of claim 13, wherein the first high-voltage final stage further comprises one or more components, each of the one or more components being arranged in series with a signal output from a first amplification element of the plurality of first amplification elements, such that the first amplification element counteracts any change in a signal level at a signal output of the first amplification element.

15. The rapidly regulable high-voltage supply of claim 13, wherein the plurality of first amplification elements are metal oxide field effect transistors.

16. A method for operating a system for rapidly regulating a high-voltage signal, the system comprising a first high-voltage final stage comprising a first high-voltage connection, a plurality of first amplification elements that have an interconnection in a series configuration with the first high-voltage connection, and a potential dividing chain comprising a series of potential dividing elements, the potential dividing chain being interconnected with the first high-voltage connection, and when the series of first amplification elements and potential dividing elements is numbered starting from the first high-voltage connection, in each case a signal input to a first amplification element of the plurality of first amplification elements numbered n having a first signal interconnection with a potential dividing element of the series of potential dividing elements numbered n, so that when a voltage is applied across the potential dividing chain, a difference in voltages at a signal input to a first amplification element numbered n and at a signal input to the first amplification element numbered n+1 in every case has the same sign, the system further comprising a second high-voltage final stage comprising an actuation element, a high-voltage output, and a regulator configured for producing at a first control signal output a first regulating signal from a set-point signal and an actual value signal, wherein the actual value signal is derived from a signal from the high-voltage output, wherein the actuation element for the first high-voltage final stage has a second signal interconnection with the first control signal output, wherein the method comprises:

controlling, with the regulator, the actuation elements such that at any time, only one of the first high-voltage final stage and the second high-voltage final stage conducts a current through the amplification elements to the high-voltage output.

17. The method of claim 16, wherein a level of the first regulating signal, a second regulating signal, or the first regulating signal and the second regulating signal is dependent on a difference between the set-point signal and the actual value signal.

18. The method of claim 17, wherein the level of the first regulating signal, the second regulating signal, or the first regulating signal and the second regulating signal changes between a first predefined value and a second predefined value, and a ratio between a first time duration, during which the level assumes a first value, and a second time duration, during which the level assumes a second value, is dependent on the difference between the set-point signal and the actual value signal.

* * * * *